(12) United States Patent  (10) Patent No.: US 8,993,433 B2
Chen et al.  (45) Date of Patent: Mar. 31, 2015

(54) MANUFACTURING METHOD FOR FORMING A SELF ALIGNED CONTACT

(71) Applicant: United Microelectronics Corp., Hsin-Chu (TW)

(72) Inventors: Chieh-Te Chen, Kaohsiung (TW); Yu-Tsung Lai, Tainan (TW); Hsuan-Hsu Chen, Tainan (TW); Feng-Yi Chang, Tainan (TW); Chih-Sen Huang, Tainan (TW); Ching-Wen Hung, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 40 days.

(21) Appl. No.: 13/902,977

(22) Filed: May 27, 2013

(65) Prior Publication Data

US 2014/0349476 A1   Nov. 27, 2014

(51) Int. Cl.
*H01L 21/4763* (2006.01)
*H01L 21/44* (2006.01)
*H01L 21/768* (2006.01)

(52) U.S. Cl.
CPC .... *H01L 21/76816* (2013.01); *H01L 21/76843* (2013.01)
USPC .......................................... 438/620; 438/675

(58) Field of Classification Search
None
See application file for complete search history.

(56) References Cited

U.S. PATENT DOCUMENTS

| | | | |
|---|---|---|---|
| 5,998,873 A | 12/1999 | Blair et al. | |
| 6,855,607 B2 | 2/2005 | Achuthan et al. | |
| 7,013,446 B2 | 3/2006 | Ohba et al. | |
| 7,112,495 B2 | 9/2006 | Ko et al. | |
| 7,214,620 B2 | 5/2007 | Kim et al. | |
| 7,250,658 B2 | 7/2007 | Doris et al. | |
| 7,521,324 B2 | 4/2009 | Ohmi et al. | |
| 7,524,742 B2 * | 4/2009 | Chou et al. | 438/503 |
| 7,531,437 B2 | 5/2009 | Brask et al. | |
| 7,592,270 B2 | 9/2009 | Teo et al. | |
| 2007/0015365 A1 | 1/2007 | Chen et al. | |
| 2007/0072376 A1 | 3/2007 | Chen et al. | |
| 2007/0218661 A1 | 9/2007 | Shroff et al. | |
| 2008/0061366 A1 | 3/2008 | Liu et al. | |
| 2009/0057759 A1 | 3/2009 | Obradovic et al. | |
| 2009/0124097 A1 | 5/2009 | Cheng | |
| 2009/0200494 A1 | 8/2009 | Hatem et al. | |

(Continued)

OTHER PUBLICATIONS

Hung,Title of Invention:Semiconductor Structure and Manufacturing Method Thereof, U.S. Appl. No. 13/875,293, filed May 2, 2013.

*Primary Examiner* — Scott B Geyer
(74) *Attorney, Agent, or Firm* — Winston Hsu; Scott Margo (57) ABSTRACT

The present invention provides a manufacturing method of a semiconductor device, at least containing the following steps: first, a substrate is provided, wherein a first dielectric layer is formed on the substrate, at least one metal gate is formed in the first dielectric layer and at least one source drain region (S/D region) is disposed on two sides of the metal gate, at least one first trench is then formed in the first dielectric layer, exposing parts of the S/D region. The manufacturing method for forming the first trench further includes performing a first photolithography process through a first photomask and performing a second photolithography process through a second photomask, and at least one second trench is formed in the first dielectric layer, exposing parts of the metal gate, and finally, a conductive layer is filled in each first trench and each second trench.

13 Claims, 11 Drawing Sheets

(56) References Cited

U.S. PATENT DOCUMENTS

| | | |
|---|---|---|
| 2010/0040768 A1 | 2/2010 | Dhindsa |
| 2010/0044783 A1 | 2/2010 | Chuang et al. |
| 2010/0048027 A1 | 2/2010 | Cheng et al. |
| 2010/0129994 A1 | 5/2010 | Awad et al. |
| 2012/0139061 A1 | 6/2012 | Ramachandran et al. |
| 2014/0327080 A1* | 11/2014 | Hung et al. .................. 257/365 |

* cited by examiner

MANUFACTURING METHOD FOR FORMING A SELF ALIGNED CONTACT

BACKGROUND OF THE INVENTION

1. Field of the Invention

The present invention relates generally to semiconductor manufacturing process, and more specifically, to a method for forming a self aligned contact through a plurality of photolithography processes.

2. Description of the Prior Art

Along with the continuous miniaturization of the Integrated Circuits (IC), the line width of interconnections and the feature size of semiconductor devices have continuously shrunk. In general, discrete devices in integrated circuits are connected to each other through contact plugs (or contact slots) and interconnection structures, and their related fabrication methods have become an important matter in the next-generation semiconductor devices.

In current fabricating processes, due to the limitations of the back end of the line (BEOL) process capacity, the yield of contact plugs with high aspect ratio (HAR) is relatively low and cannot reach the new requirements. In order to overcome this drawback, a contact can be divided into two parts, a lower contact structure and an upper contact structure (i.e. the metal level zero, M0). After the lower contact structure is formed completely, the M0 is continuously formed. The M0 can be a pole structure or a slot structure. However, since the upper contact structure (M0) and the lower contact structure are formed in different steps, a barrier layer will exist between the upper contact structure (M0) and the lower contact structure, thereby affecting the conductivity of the contact. Besides, the manufacturing process is too complex.

Accordingly, in order to overcome the above-mentioned drawbacks, there is a need to provide a modified method for fabricating interconnection structures with better yields.

SUMMARY OF THE INVENTION

To solve the issues mentioned above, the present invention provides a manufacturing method of a semiconductor device, at least comprising the following steps: first, a substrate is provided, wherein a first dielectric layer is formed on the substrate, at least one metal gate is formed in the first dielectric layer and at least one source drain region (S/D region) is disposed on two sides of the metal gate, at least one first trench is then formed in the first dielectric layer, exposing parts of the S/D region, wherein the manufacturing method for forming the first trench further comprises performing a first photolithography process through a first photomask and performing a second photolithography process through a second photomask, and at least one second trench is formed in the first dielectric layer, exposing parts of the metal gate, finally, a conductive layer is filled in each first trench and each second trench.

The present invention comprises forming a self aligned contact through at least two photolithography processes. In this way, the size of the contact corresponding to the S/D (i.e. M0CT) can be precisely controlled, and the contacts disposed corresponding to the metal gate (i.e. M0PY) and the contacts disposed corresponding to the S/D region (M0CT) can be formed simultaneously, and replace the $0^{th}$ metal layer (M0) and the lower contact structure in a conventional process, thereby reducing the manufacturing steps.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
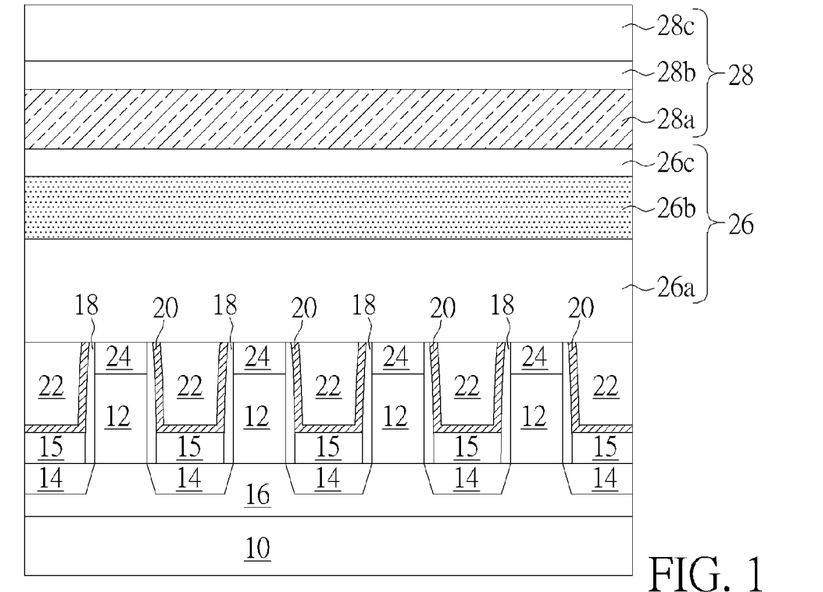
FIGS. 1-12 are schematic diagrams illustrating a manufacturing method of the semiconductor device according to a first preferred embodiment of the present invention.

Please refer to FIGS. 1-9 are schematic diagrams illustrating a manufacturing method of the semiconductor device according to a first preferred embodiment of the present invention. As shown in FIG. 1, a substrate 10 is first provided, wherein the substrate 10 comprises at least one metal gate 12 disposed on the substrate 10, and at least one source/drain region (S/D region) 14 disposed on at least one side of the metal gate 12. Besides, the substrate 10 selectively comprises at least one fin structure 16. In this embodiment, the metal gate 12 comprises metal materials, the S/D region 14 can be formed on two sides of the metal gate 12 of the substrate 10 through an ion implantation process, or formed on the fin structure 16 disposed on two sides of the metal gate 12. The method of the present invention further comprises forming at least one shallow trench isolation (STI, not shown) in the substrate 10 surrounding the metal gate 12, to isolate the metal gate 12 from other electric elements on the substrate 10.

In addition, the method of the present invention further comprises selectively forming an epitaxy layer 15 on the S/D region 14. The epitaxy layer 15 can be regarded as a part of the S/D region 14. Afterwards, a spacer 18 and a contact etching stop layer (CESL) 20 may be formed on two sides of the metal gate 12. A first dielectric layer 22 is then formed on the substrate 10, and a planarization process is then performed, such as a chemical mechanical polishing (CMP), to have the top surface of the metal gate 12 and the top surface of the first dielectric layer 22 on the same level. Please note that the metal gate 12 can be formed by replacing a dummy gate with metal after the planarization process. It is worth noting that in this embodiment, a hard mask 24 is disposed on the metal gate 12, the manufacturing method of the hard mask comprises: after the metal gate 12 is completed, an etching process is performed to remove parts of the metal gate 12, and the hard mask 24 is then formed on the metal gate 12. Another planarization process is then performed to remove the extra hard mask 24. In other words, in the present embodiment, the top surface of the hard mask 24 and the top surface of the first dielectric layer 22 are on the same level (as shown in FIG. 1). Besides, since the hard mask 24 replaces some top portion of the metal gate 12, the hard mask 24 is therefore disposed only on the metal gate 12, and disposed between the spacers 18. In addition, since parts of the spacer 18 and parts of the CESL 20 are removed during another planarization process, the spacer 18 and the CESL 20 have a truncated top surface. In the present embodiment, the thickness of the CESL 20 is about 50 angstroms, the thickness of the hard mask 24 is about 350 angstroms, but not limited thereto. Besides, the spacer 18, the CESL 20 and the hard mask 24 mainly comprise silicon nitride, and the first dielectric layer 22 mainly comprises silicon oxide, but not limited thereto. These elements and the manufacturing methods thereof are well known to persons of ordinary skills in the art and the details will not be described here.

Afterwards, a second dielectric layer 26 is then formed on the first dielectric layer 22. According to the preferred embodiment, the second dielectric layer 26 is preferably a multiple layer structure, preferably including a bottom layer 26a, a middle layer 26b and a top layer 26c. In this embodiment, the bottom layer 26a is an oxide layer, the middle layer 26b is an advanced pattering film (APF), and the top layer 26c is another oxide layer, but not limited thereto. A photoresist layer 28 is then formed on the second dielectric layer 26, the photoresist layer 28 sequentially includes an organic dielectric layer (ODL) 28a, a silicon-containing hard mask bottom anti-reflecting coating (SHB) 28b and a photoresist (PR) layer 28c. In short, the photoresist layer 28 is a tri-layer structure consisting of an ODL/SHB/PR structure, but not limited thereto.

Figure 2:
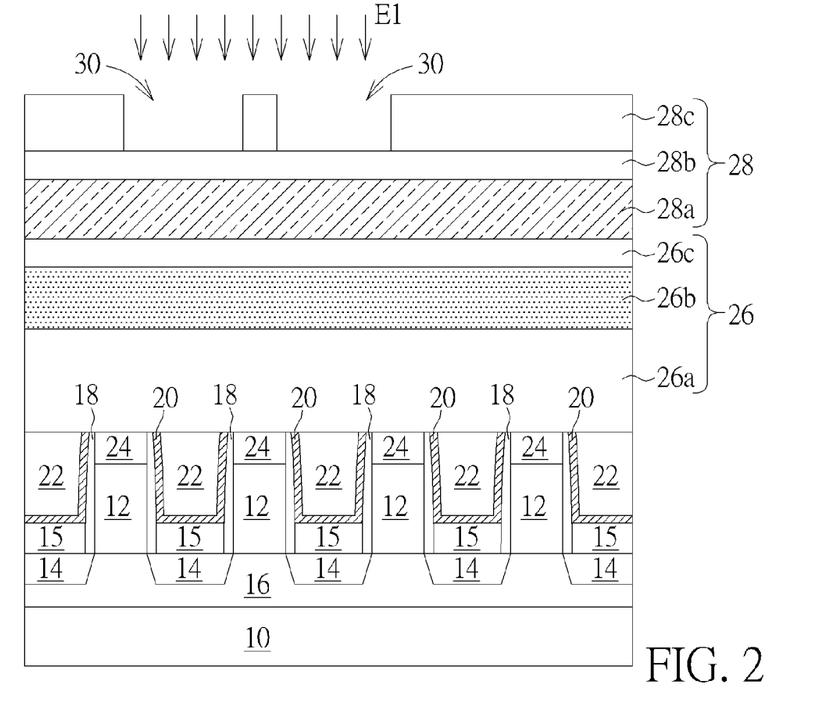
Figure 3:
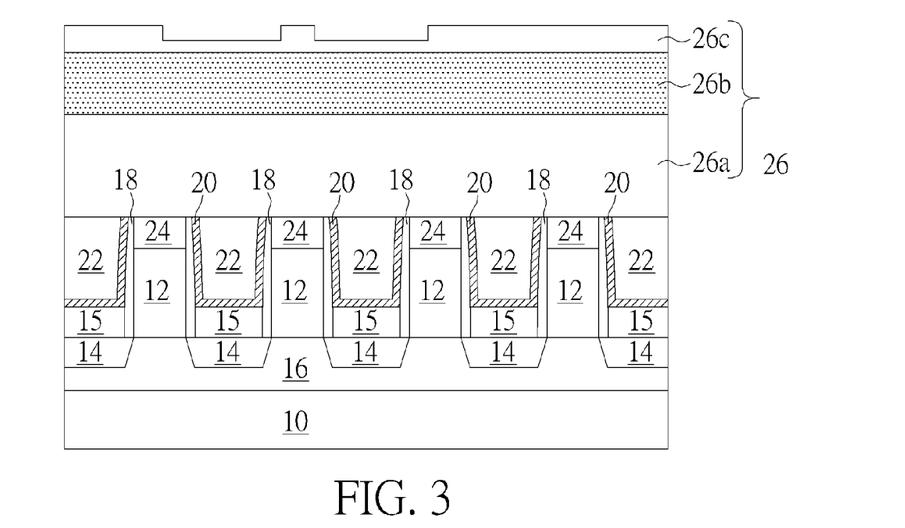

Afterwards, as shown in FIGS. 2-3, in order to form the metal plug that is electrically connected to the S/D region 14 (wherein the metal plug can replace the M0 and the lower contacts structure electrically connected to the S/D region in conventional process, denoted here as the 0th metal contact, M0CT), a M0CT etching process E1 is performed through a first photomask (not shown), to pattern the photoresist layer 28c and to form a plurality of first patterns 30 on the photoresist layer 28c. In addition, as shown in FIG. 3, the M0CT etching process E1 further comprises transferring the first patterns 30 to other layers disposed below through at least one etching process, to etch the SHB 28b, the ODL 28a and the top layer 26c. It is worth noting that the top layer 26c is only partially etched, and still covers the middle layer 26b in this step. In other words, the middle layer (in this embodiment, the middle layer 26b is APF) is not exposed and is still covered by the top layer 26c in the step.

Figure 4:
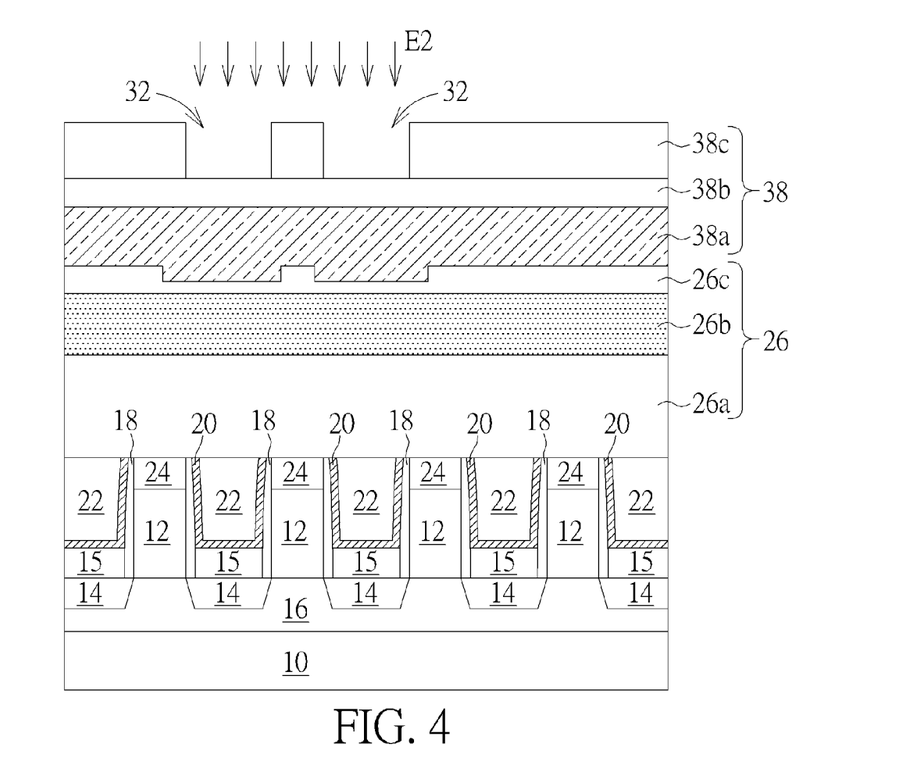
Figure 5:
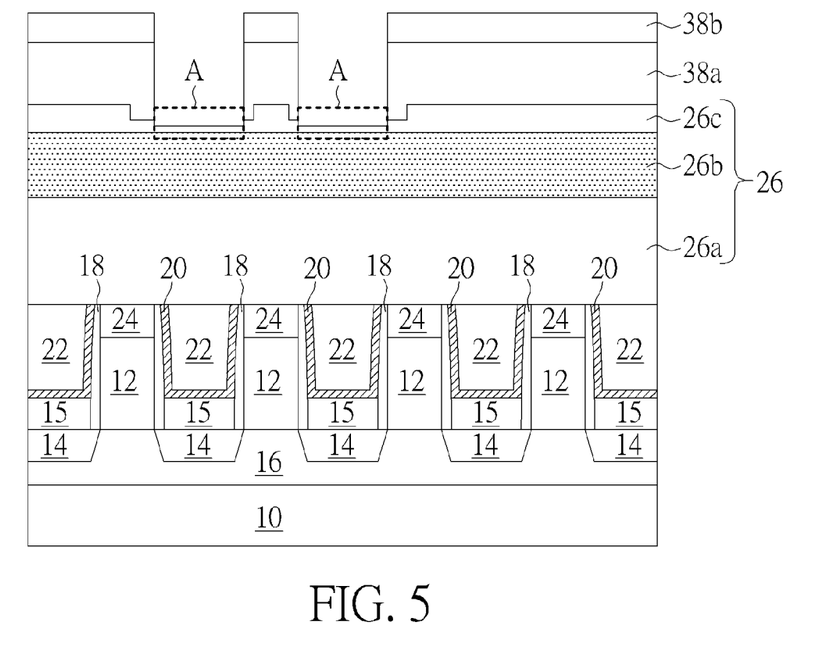

As shown in FIG. 4, a photoresist layer 38 is then formed on the second dielectric layer 26, wherein the material of the photoresist layer 38 may be the same as the material of the photoresist layer 28, comprising an organic dielectric layer (ODL) 38a, a silicon-containing hard mask bottom anti-reflecting coating (SHB) 38b and a photoresist layer 38c. Next, a M0CT etching process E2 is performed through a second photomask (not shown), to pattern the photoresist layer 38c and to form a plurality of second patterns 32 on the photoresist layer 38c. In addition, as shown in FIG. 5, the M0CT etching process E2 further comprises transferring the second patterns 32 to other layers disposed below through at least one etching process, including etching the SHB 38b and the ODL 38a and the top layer 26c, stopping on the surface of the middle layer 26b. It is worth noting that after the M0CT etching process E1 and the M0CT etching process E2 are performed, the thickness of the top layer 26c which is disposed on the overlapping area of the of the first pattern 30 and the second pattern 32 is relatively thin (such as the region A shown in FIG. 5), and easily to be etched through. Next, another etching process is then performed (not shown), to expose the middle layer 26b, wherein the area of the exposed middle layer 26c is equal to the overlapping area of the first pattern 30 and the second pattern 32, in other words, only the overlapping area of the first pattern 30 and the second pattern 32 can be opened in the top layer 26c, to form the contacts corresponding the S/D region (M0CT) in the following steps, therefore, the M0CT of the present invention is a self-aligned contact.

In this embodiment, the first photomask includes first patterns 30, and the second photomask includes second patterns 32, the dimension of each first pattern 30 is larger than the dimension of the second pattern 32, but not limited thereto, the dimension of each first pattern 30 may also be smaller than the dimension of the second pattern 32. In addition, the M0CT etching process E1 is performed before the M0CT etching process E2 is performed in the above description, but the present invention is not limited thereto. In other words, the M0CT etching process E1 may also be performed after the M0CT etching process E2 is performed. However, whether the M0CT etching process E1 or the M0CT etching process E2 is performed first, the middle layer 26b will be opened after both the M0CT etching process E1 and M0CT etching process E2 are performed, and the opened area is equal to the overlapping area of first pattern 30 and the second pattern 32.

Figure 6:
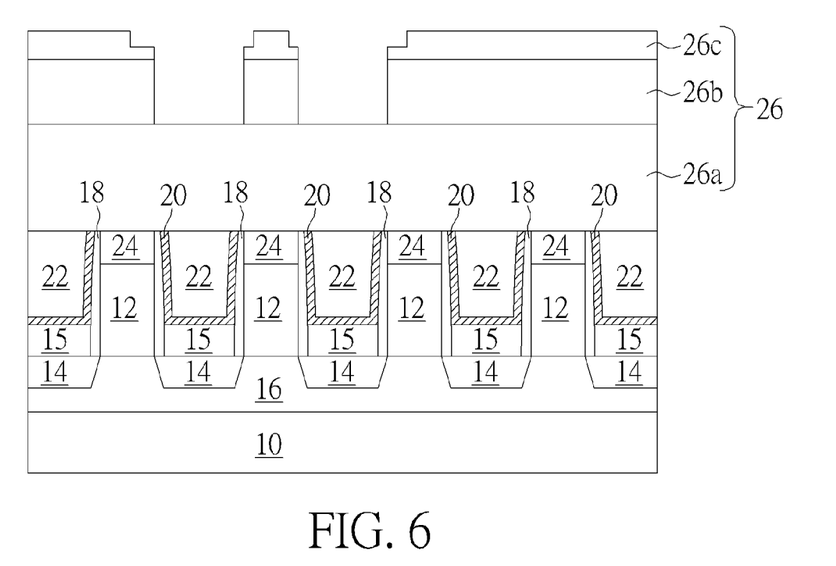
Figure 7:
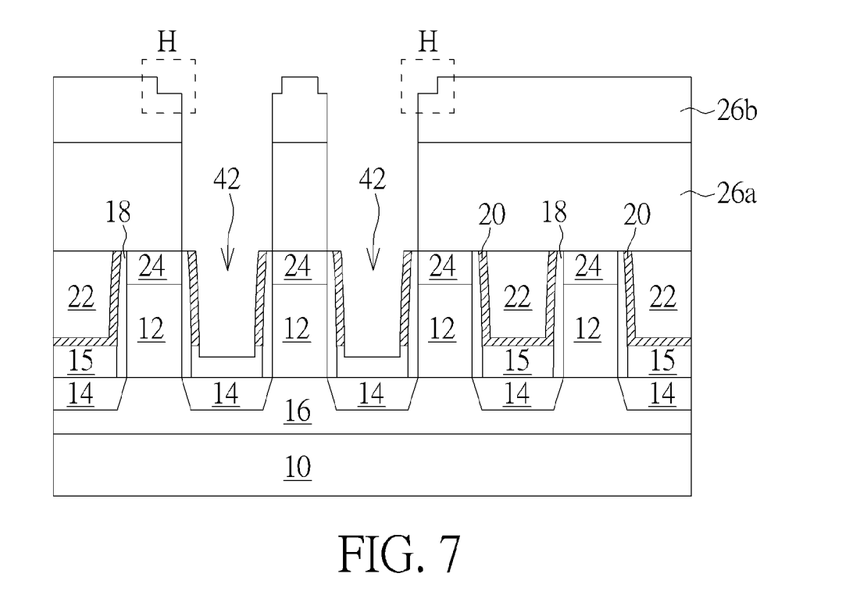
Figure 8:
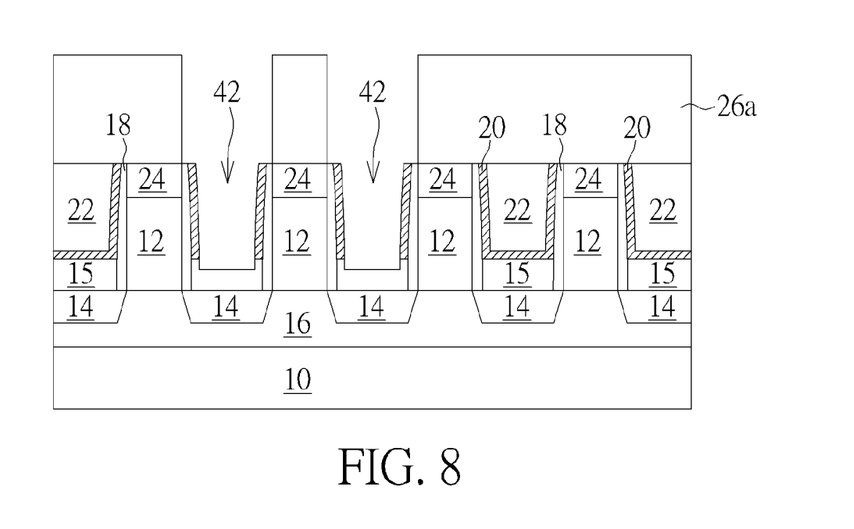

As shown in FIGS. 6-8, parts of the second dielectric layer 26 are used as a hard mask for etching the first dielectric layer 22, and to expose the S/D region 14. At least one first trench 42 is then formed. In more detail, as shown in FIG. 6, an etching process is performed to transfer the overlapping area of the first pattern 30 and the second pattern 32 to the middle layer 26b. As shown in FIG. 7, the top layer 26c is removed, and the bottom layer 26a and the first dielectric layer 22 are etched, to form at least one first trench 42 in the first dielectric layer 22, in the bottom layer 26a and in the middle layer 26b. As shown in FIG. 8, the middle layer 26b is removed. It is worth noting that in this embodiment, the middle layer is preferably an APF, the APF is easily removed, and therefore the step-height portion H (shown in FIG. 7) will not remain after the middle layer 26b is removed. However, the middle layer 26b is not limited to being an APF, and it can be adjusted according to actual requirements. Besides, since the first trench 42 is formed by etching through the exposed middle layer 26b shown in FIG. 5, and because the exposed area of the middle layer 26b is equal to the overlapping area of the first pattern 30 and the second pattern 32, the projected area of the first trench 42 is the same as the overlapping area of the first pattern 30 and the second pattern 32 too.

Figure 9:
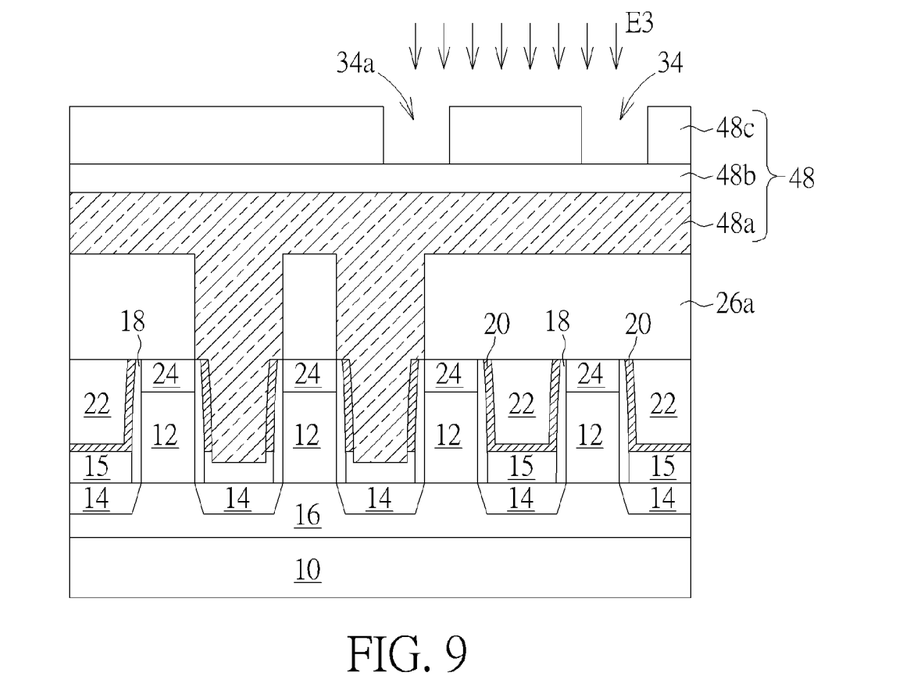

Afterwards, as shown in FIG. 9, in order to form the metal plug that is electrically connected to the metal gate 12 (wherein the metal plug can replace the M0 and the lower contacts structure electrically connected to the metal gate in conventional process, denoted here as the 0th metal gate contact, M0PY), a photoresist layer 48 is then formed on the second dielectric layer 26 (the bottom layer 26a) and filled in each first trench 42, wherein the material of the photoresist layer 48 may be the same as the material of the photoresist layer 28, comprising an organic dielectric layer (ODL) 48a, a silicon-containing hard mask bottom anti-reflecting coating (SHB) 48b and a photoresist layer 48c. A M0PY etching process E3 is then performed through a third photomask (not shown), to pattern the photoresist layer 48c and to form a plurality of third patterns 34 on the photoresist layer 48c. Each third pattern 34 is mainly disposed corresponding to the metal gate 12 disposed below, but not limited thereto, and some third patterns 34 may be disposed corresponding to the edge of the metal gate 12 (such as the third pattern 34a shown in FIG. 9).

Figure 10:
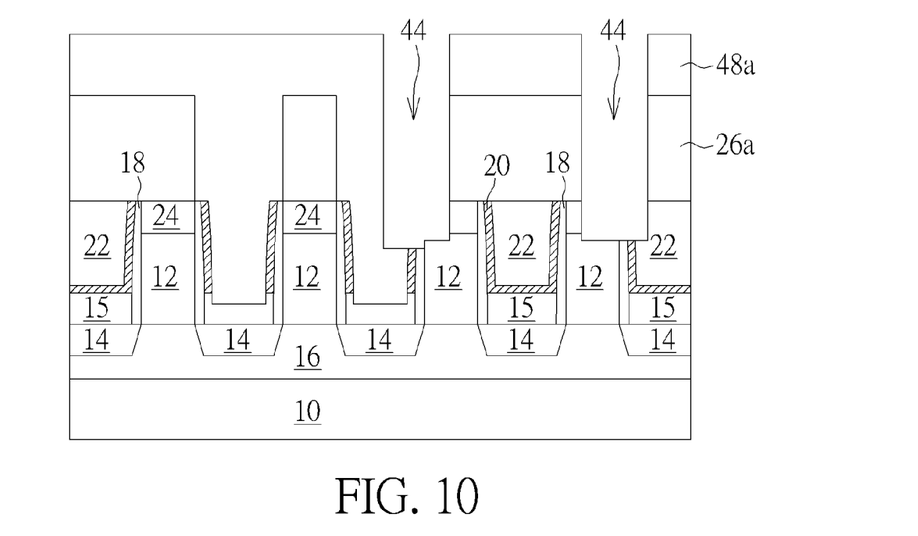

As shown in FIG. 10, the M0PY etching process E3 further comprises performing at least one etching process, to transfer the third pattern 34 into other layers below, such as the SHB 48b, the ODL 48a and the bottom layer 26a. In addition, the hard mask 24, the first dielectric layer 22, the CESL 20 and the spacer 18 are partially removed through the etching process, to form at least one second trench 44, and the metal gate 12 is exposed by the second trench 44. It is worth noting that, since the main material of the bottom layer 26a and the first dielectric layer 22 (mainly comprises silicon oxide layer) is different from the main material of the hard mask 24, the CESL 20 and the spacer 18 (mainly comprises silicon nitride), a low-selectivity etching gas to silicon nitride and silicon oxide may be used to form the second trenches 44, but the present invention is not limited thereto. The second trenches 44 may be formed through a plurality of etching processes, to etch different materials.

Figure 11:
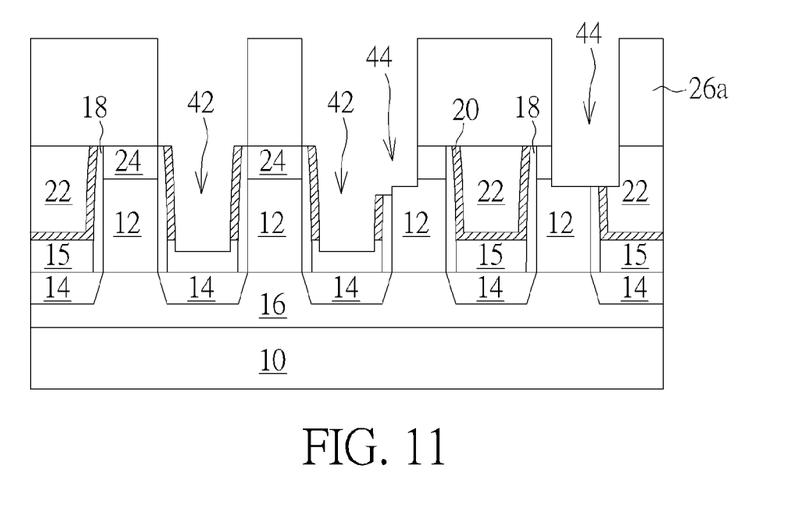
Figure 12:
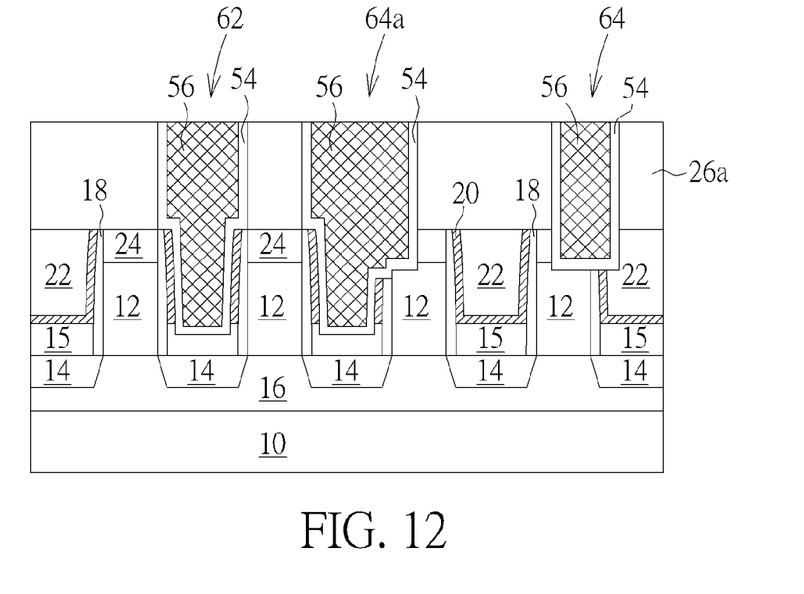

As shown in FIGS. 11-12, after an ash process is performed to remove the rest of the photoresist layer 48 (ODL 48a). As shown in FIG. 11, a barrier layer 54 and a metal layer 56 are filled in each first trench 42 and each second trench 44 simultaneously, wherein the barrier layer 54 may comprise titanium nitride (TiN) and tantalum nitride (TaN) to improve the adhesivity between the inner surface of each trench and the metal layer formed in the following steps. The metal layer 56 preferably comprises tungsten (W), which has better gap fill performances. A planarization process is then performed to remove the extra barrier layer and the metal layer disposed on the top surface of the bottom layer 26a to simultaneously form a plurality of first contacts 62 and a plurality of second contacts 64 in the first dielectric layer 22 and in the second dielectric layer 26, wherein each first contact 62 at least is electrically connected to parts of the S/D region 14 (in other words, the first contacts 62 of the present embodiment are the M0CT mentioned above), each second contact 64 is at least electrically connected to parts of the metal gate 12 (in other words the second contacts 64 of the present embodiment are the M0PY mentioned above). In addition, since the first contacts 62 and the second contacts 64 are filled by the metal layer 56 and completed simultaneously, each first contact 62 and each second contact 64 is a monolithically formed structure. It is worth noting that in the present invention, parts of the second trenches 44 and parts of the first trenches 42 are partially overlapped, so parts of the first contact 62 will be connected to parts of the second contacts 64 (such as the second contact 64a shown in FIG. 12). These connection portions of the first contacts 62 and the second contacts 64 may be used as share contacts of a semiconductor device, but not limited thereto.

The following description will detail the different embodiments of manufacturing method of the semiconductor device of the present invention. To simplify the description, the following description will detail the dissimilarities among the different embodiments and the identical features will not be redundantly described. In order to compare the differences between the embodiments easily, the identical components in each of the following embodiments are marked with identical symbols.

In the manufacturing process mentioned in the first embodiment, the first trenches 42 are formed before the second trenches 44 are formed; however, the present invention is not limited thereto. In another embodiment of the present invention, the second trench 44 is formed before the first trench 42 is formed. And a barrier layer 44 and a metal layer 46 are then filled into the first trenches 42 and the second trenches 44. A planarization process is then performed to complete a plurality of first contacts 62 and a plurality of second contacts 64. This manufacturing sequence should be comprised in the scope of the present invention. Compared with conventional manufacturing processes, the first contacts 62 and the second contacts 64 are a monolithically formed structure respectively and there is no barrier layer disposed between the "upper portion" and the "lower portion" of the contact.

Figure 13:
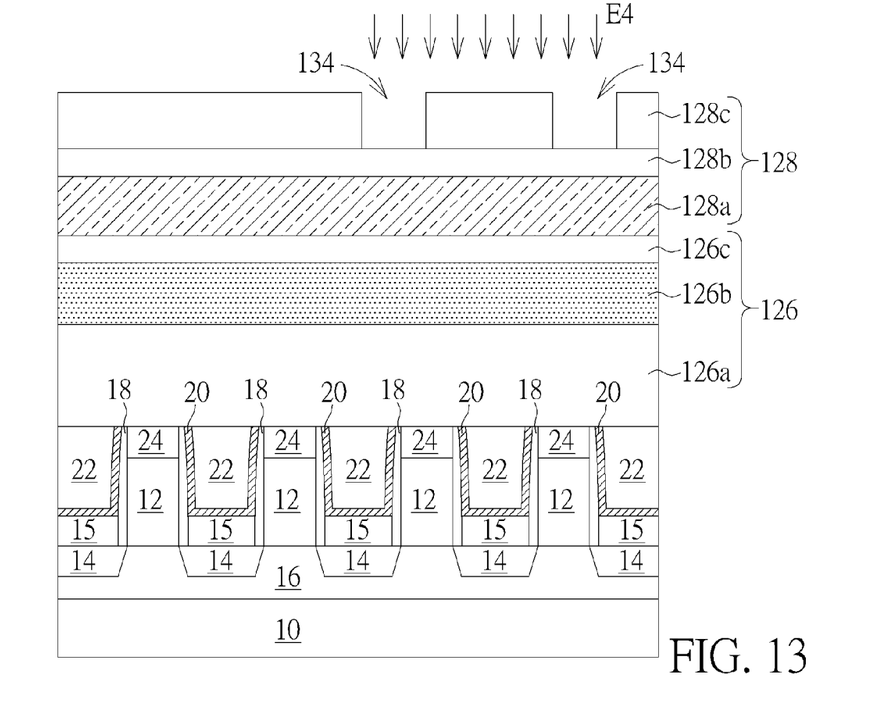
FIGS. 13-21 are schematic diagrams illustrating a manufacturing method of the semiconductor device according to a second preferred embodiment of the present invention.

For more detail, please refer to FIG. 12 and FIGS. 13-21, FIGS. 13-21 are schematic diagrams illustrating a manufacturing method of the semiconductor device according to a second preferred embodiment of the present invention. As shown in FIG. 13, a substrate 10 is first provided, wherein the substrate 10 comprises at least one metal gate 12 disposed on the substrate 10, and at least one source/drain region (S/D region) 14 disposed on two sides of the metal gate 12. Besides, the substrate 10 selectively comprises at least one fin structure 16. The method of the present invention further comprises forming at least one shallow trench isolation (STI, not shown) in the substrate 10 surrounding the metal gate 12, to isolate the metal gate 12 from the fin structures 16 and other electric elements on the substrate 10. In addition, the method of the present invention further comprises selectively forming an epitaxy layer 15 on the S/D region 14. Afterwards, a spacer 18 and a contact etching stop layer (CESL) 20 may be formed on two sides of the metal gate 12. A first dielectric layer 22 is then formed on the substrate 10, and a hard mask 24 is disposed on the top of the metal gate 12, the top surface of the hard mask 24 and the top surface of the first dielectric layer 22 are on the same level. The spacer 18, the CESL 20 and the hard mask 24 mainly comprise silicon nitride, and the first dielectric layer 22 mainly comprises silicon oxide, but not limited thereto. These elements are similar to the first preferred embodiment detailed above and will not be redundantly described.

Afterwards, a second dielectric layer 126 is then formed on the first dielectric layer 22. According to the preferred embodiment, the second dielectric layer 126 is preferably a multiple layer structure, preferably including a bottom layer 126a, a middle layer 126b and a top layer 126c. A photoresist layer 128 is then formed on the second dielectric layer 126, the photoresist layer 128 sequentially includes an organic dielectric layer (ODL) 128a, a silicon-containing hard mask bottom anti-reflecting coating (SHB) 128b and a photoresist (PR) layer 128c. In short, the photoresist layer 128 is a tri-layer structure consisting of an ODL/SHB/PR structure, but not limited thereto. The difference between this embodiment and the first embodiment is in this embodiment, the bottom layer 126a is an oxide layer, the middle layer 126b is preferably a metal layer, such as a titanium nitride (TiN), which has high selectivity with silicon oxide and silicon nitride, and the top layer 126c is another oxide layer, but not limited thereto. Afterwards, a M0PY etching process E4 is performed to pattern the photoresist layer 128c and to form a plurality of third patterns 134 on the photoresist layer 128c. Each third pattern 134 is mainly disposed corresponding to the metal gate 12 disposed below, but not limited thereto, some third patterns 134 may be disposed corresponding to the edge of the metal gate 12.

Figure 14:
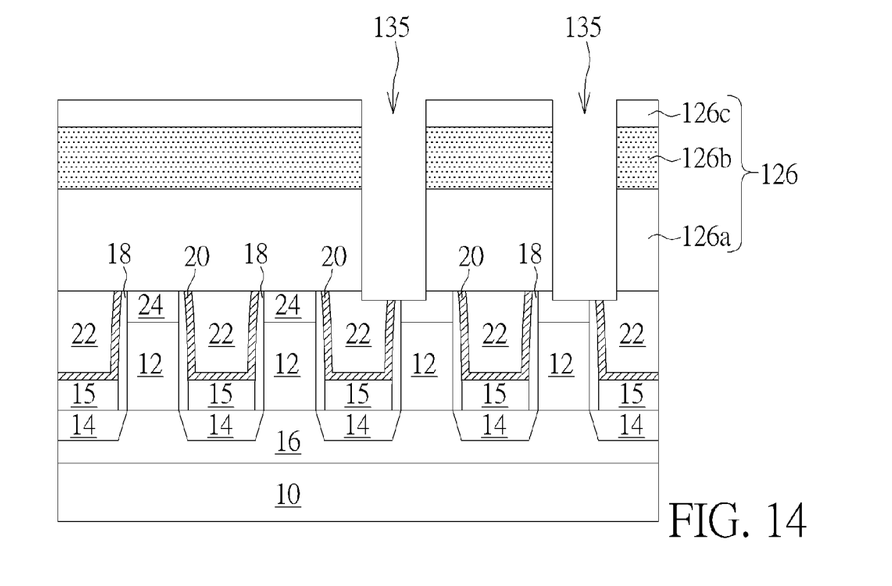
Figure 15:
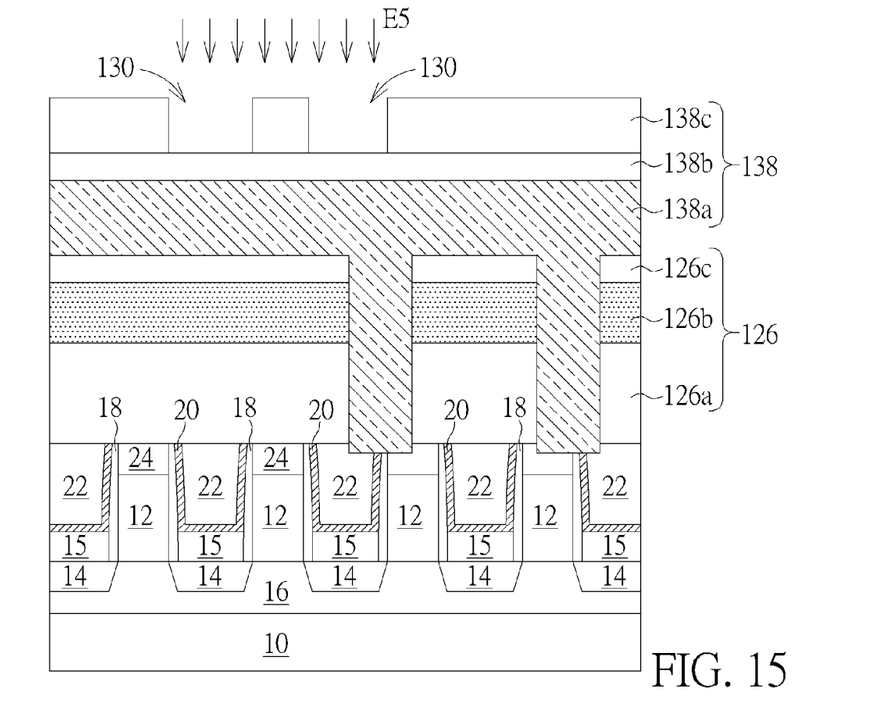
Figure 16:
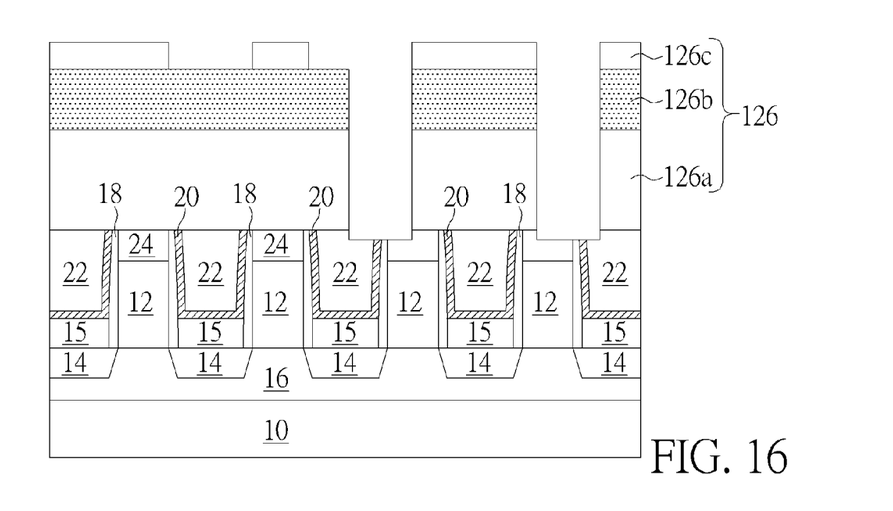

As shown in FIG. 14, the etching process is continuously performed, transferring the third pattern 134 to the layer disposed below, until the parts of the hard mask 24 are exposed, to form at least one opening 135. Next, as shown in FIGS. 15-16, a photoresist layer 138 is then formed in each opening 135 and covers the whole surface, the photoresist layer 138 sequentially includes an organic dielectric layer (ODL) 138a, a silicon-containing hard mask bottom anti-reflecting coating (SHB) 138b and a photoresist (PR) layer 138c. Afterwards, a M0CT etching process E5 is performed through a first photomask (not shown), to pattern the photoresist layer 138c and to form a plurality of first patterns 130 on oxide layer 126c, until the layer 126b is exposed. And then the ODL 138a are removed.

Figure 17:
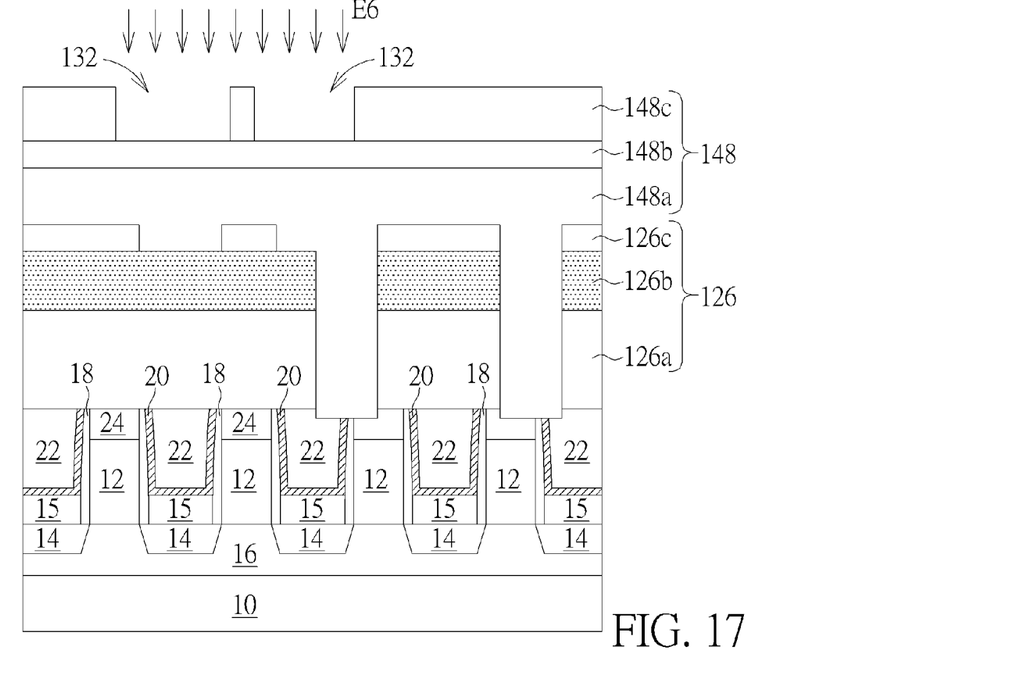
Figure 18:
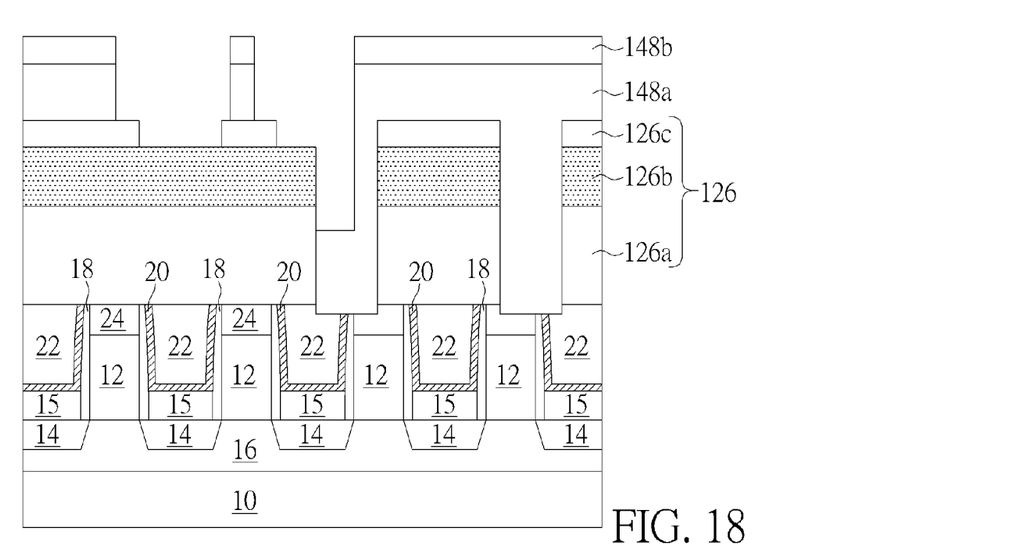
Figure 19:
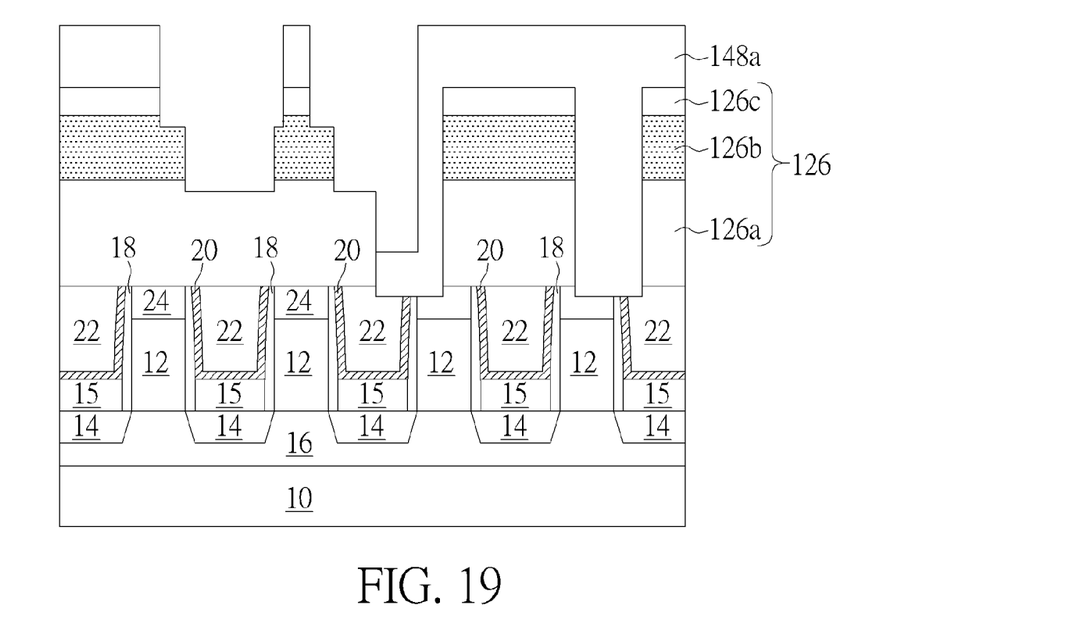

Next, as shown in FIGS. 17-19, a photoresist layer 148 is then formed in each opening 135 and covers the whole surface. The photoresist layer 148 sequentially includes an organic dielectric layer (ODL) 148a, a silicon-containing hard mask bottom anti-reflecting coating (SHB) 148b and a photoresist (PR) layer 148c. A M0CT etching process E6 is performed through a second photomask (not shown), to pattern the photoresist layer 148c and to form a plurality of second patterns 132 on the photoresist layer 148c. As shown in FIG. 18, the etching process is then performed to transfer the pattern 132 to the layers disposed below, and stop on the surface of the middle layer 126b. As shown in FIG. 19, the middle layer 126b is etched through by another etching process, and it is worth noting that since the middle layer 126b is preferably a metal layer in this embodiment, which has different selectivity with silicon oxide and silicon nitride, the etching process uses an etching gas with high-selectivity (the metal layer to silicon oxide or silicon nitride) to etch through the middle layer 126b (metal layer). It is worth noting that in this embodiment, the first photomask comprises a first pattern 130, the second photomask comprises a second pattern 132, and after the M0CT etching E5 and the M0CT etching E6 is performed, only the overlapping area of the first pattern 130 and the second pattern 132 allow to etch through the middle layer 126b (the metal layer), therefore, in this embodiment, the contact disposed corresponding to the S/D region 14 (M0CT) formed in the following step is a self-aligned contact.

Figure 20:
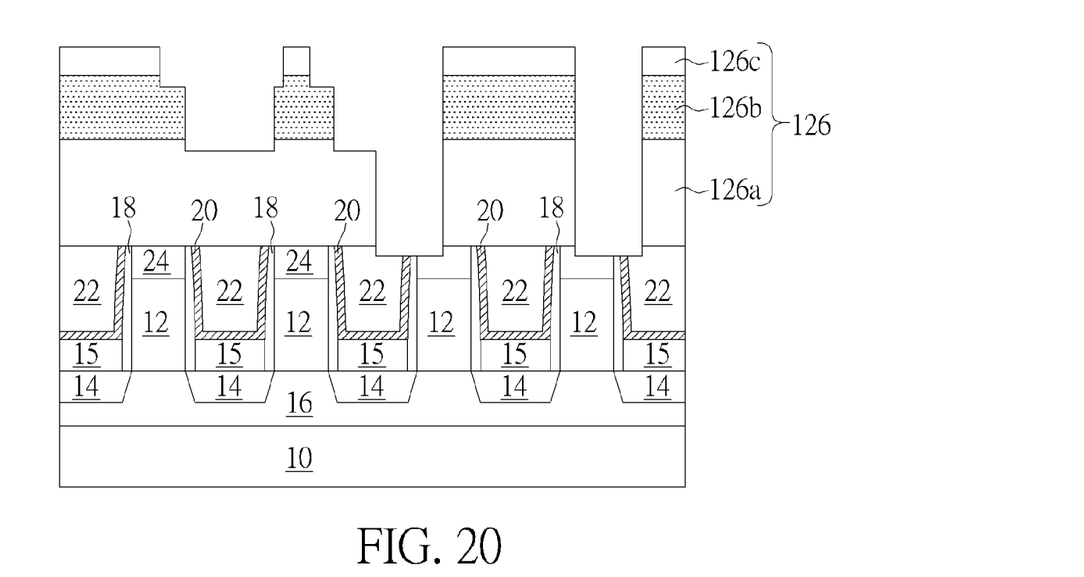
Figure 21:
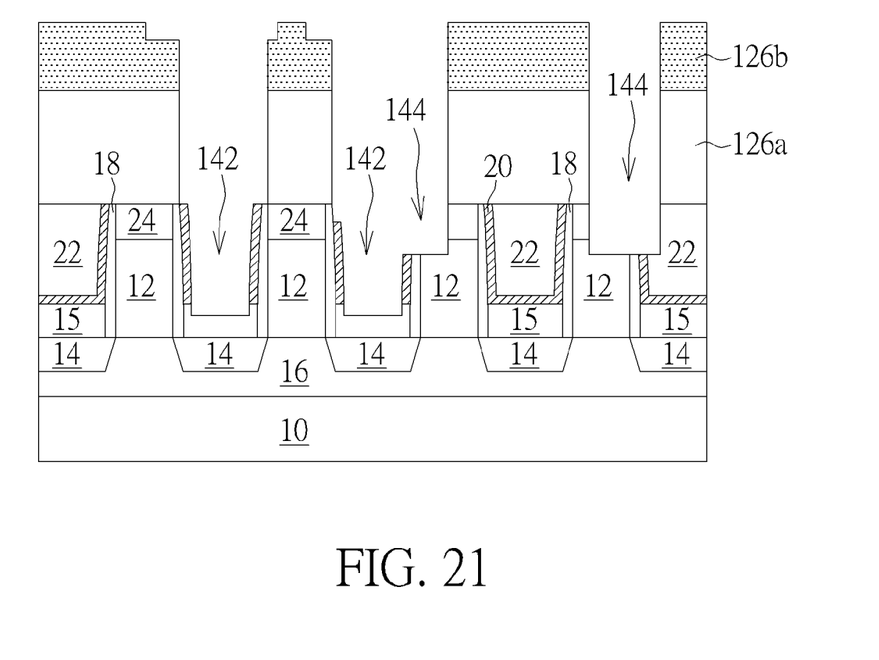

As shown in FIGS. 20 and 21, the rest of ODL 148a is removed, and parts of the first dielectric layer 22, parts of the hard mask 24 and parts of the second dielectric layer 126a are etched and removed, to expose the metal gate 12 and the S/D region 14, and to form a plurality of first trenches 142 and a plurality of second trenches 144, wherein each first trench 142 is disposed corresponding to the S/D region 14, and each second trench 144 is disposed corresponding to the metal gate 12. Finally, a barrier layer and a metal layer are filled in the first trenches 142 and in the second trenches 144; to form a plurality of contacts disposed corresponding to S/D region or corresponding to the metal gate 12. (The final structure is same with FIG. 12).

In this embodiment, after the M0PY etching process E4 is performed, the hard mask 24 still remains on the metal gate 12, and it will be removed after the first trench 142 and the second trench 144 are formed. Therefore, the metal gate 12 can be protected by the hard mask 24 while the M0CT etching process E5 and the M0CT etching process E6 are performed, thereby decreasing the damage of the metal gate 12.

It is worth noting that in the description above, the M0CT etching process E5 is performed before the M0CT etching process E6 is performed, however, the present invention is not limited thereto. In other words, the M0CT etching process E6 may also be performed before the M0CT etching process E5, and this also lies within the scope of the present invention.

In summary, the present invention comprises forming a self aligned contact through at least two photolithography processes. In this way, the size of the contact corresponding to the S/D (i.e. M0CT) can be precisely controlled, and the contacts disposed corresponding to the metal gate (i.e. M0PY) and the contacts disposed corresponding to the S/D region (M0CT) can be formed simultaneously, and replace the $0^{th}$ metal layer (M0) and the lower contact structure in a conventional process, thereby reducing the manufacturing steps.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, at least comprising the following steps:
   providing a substrate, wherein a first dielectric layer is formed on the substrate, at least one metal gate is formed in the first dielectric layer and at least one source drain region (S/D region) is disposed on two sides of the metal gate;
   forming at least one first trench in the first dielectric layer, exposing parts of the S/D region, wherein the manufacturing method for forming the first trench further comprises performing a first photolithography process through a first photomask and performing a second photolithography process through a second photomask;
   forming at least one second trench in the first dielectric layer, exposing parts of the metal gate, wherein parts of the second trenches and parts of the first trenches partially overlap each other; and
   filling a conductive layer in each first trench and each second trench.

2. The method of claim 1, further comprising forming a second dielectric layer on the first dielectric layer.

3. The method of claim 2, wherein the second dielectric layer is a multiple layer structure.

4. The method of claim 3, wherein the second dielectric layer comprises an advanced patterning film and at least one silicon oxide layer.

5. The method of claim 3, wherein the second dielectric layer comprises a metal layer and at least one silicon oxide layer.

6. The method of claim 2, wherein the manufacturing method for forming the first trench further comprises using the second dielectric layer as a hard mask to etch the first dielectric layer.

7. The method of claim 1, wherein each first trench is formed before each second trench is formed.

8. The method of claim 1, wherein each second trench is formed before each first trench is formed.

9. The method of claim 1, wherein the first photomask comprises a first pattern, the second photomask comprises a second pattern, and the dimension of the first pattern is larger than the dimension of the second pattern.

10. The method of claim 9, wherein the projected area of the first trench is equal to the overlapping area of the first pattern and the second pattern.

11. The method of claim 1, wherein the first photolithography process is performed before the second photolithography process is performed.

12. The method of claim 1, wherein the second photolithography process is performed before the first photolithography process is performed.

13. The method of claim 1, further comprising forming a hard mask on each metal gate, and the top surface of the hard mask and the top surface of the first dielectric layer are on the same level.

* * * * *